United States Patent [19]

(12) United States Patent
Chen et al.

(10) Patent No.: US 11,558,977 B2
(45) Date of Patent: Jan. 17, 2023

(54) DEDICATED AIR TUNNEL FOR POWER SUPPLY UNIT

(71) Applicant: Quanta Computer Inc., Taoyuan (TW)

(72) Inventors: Jen-Mao Chen, Taoyuan (TW); Wei-Te Wang, Taoyuan (TW); Ming-Hung Tsai, Taoyuan (TW)

(73) Assignee: QUANTA COMPUTER INC., Taoyaun (TW)

( * ) Notice: Subject to any disclaimer, the term of this patent is extended or adjusted under 35 U.S.C. 154(b) by 56 days.

(21) Appl. No.: 17/307,740

(22) Filed: May 4, 2021

(65) Prior Publication Data

US 2022/0361362 A1    Nov. 10, 2022

(51) Int. Cl.
*G06F 1/20* (2006.01)
*H05K 7/20* (2006.01)
*G06F 1/18* (2006.01)
*G06F 1/26* (2006.01)

(52) U.S. Cl.
CPC ......... *H05K 7/20145* (2013.01); *G06F 1/181* (2013.01); *G06F 1/188* (2013.01); *G06F 1/20* (2013.01); *G06F 1/26* (2013.01); *H05K 7/20172* (2013.01)

(58) Field of Classification Search
CPC ... G06F 1/20; G06F 1/206; G06F 1/26; G06F 2200/201; G06F 1/181; G06F 1/188; H05K 7/20209; H05K 7/20836; H05K 7/20172; H05K 7/20736; H05K 7/20145; H05K 7/20727; H05K 7/20136; H05K 7/20181; H05K 7/20618; H05K 7/20772; F04D 25/166; F04D 29/544; F04D 29/665
USPC ........... 361/679.48, 695, 679.33, 679.4, 690, 361/679.46, 692, 688; 165/122, 104.33, 165/80.3, 299, 97, 287; 454/184, 353
See application file for complete search history.

(56) References Cited

U.S. PATENT DOCUMENTS

2016/0324032 A1\* 11/2016 Davis ................... G11B 33/142

\* cited by examiner

*Primary Examiner* — Mandeep S Buttar
(74) *Attorney, Agent, or Firm* — Nixon Peabody LLP

(57) ABSTRACT

A power supply system for a computer system having a fan module that protects the power supply system from backflow from the fan module is disclosed. A power supply unit has an internal fan emitting an airflow from one end of the power supply unit. The power supply unit is mountable next to the fan module. The power supply system is mountable in proximity to an air baffle that diverts the airflow generated by the internal fan. An air tunnel is located on one side of the power supply unit. The air tunnel has an opening on one end for receiving the airflow diverted by the air baffle from the internal fan. The air tunnel has an opposite end in proximity to a second opening to divert the received airflow under the power supply unit.

19 Claims, 9 Drawing Sheets

DEDICATED AIR TUNNEL FOR POWER SUPPLY UNIT

TECHNICAL FIELD

The present disclosure relates generally to systems and methods for optimizing thermal performance in computer systems. More particularly, aspects of this disclosure relate to an air tunnel for air circulation to a power supply unit.

BACKGROUND

Computing systems (e.g., desktop computers, blade servers, rack-mount servers, etc.) are employed in large numbers in various applications. High-demand applications, such as network based systems, data centers, or high-density finite element simulations, can stretch operational limits of hardware of a computing system, causing excess heat to be generated during operation. For example, a hard drive of a server, memory modules installed in the server, and processors of the server, etc., operating at high capacity can generate excess heat. Heat generated by individual components in the computing system is generally dissipated to avoid damage or performance degradation of the individual components. For example, excessive heat can melt interconnects of fragile electronics or can damage substrates of these electronics.

Thermal management is an important aspect of optimizing the performance of the computing system. Thermal management can be performed at the component level, for example, at the level of individual components that heat up. Central processing units (CPUs), graphics processing units (GPUs), and dual in-line memory modules (DIMMs) are examples of components usually considered when performing component-level thermal management. Other systems such as a fan wall of fan modules may be used to circulate air throughout the computer system.

In a typical server chassis arrangement of a computing system, power supply units (PSU)s are stacked on top of the fan modules in a fan wall. PSUs typically include a voltage regulator, AC/DC conversion components, and a separate fan. Because of the proximity of the PSU to the fan modules in the fan wall, the airflow created by the fans in the fan modules may affect operation of the PSU. As total power consumption for the computer system increases due to power requirement of more powerful components, high-performance fans for cooling the computing system must be provided to reach the cooling target of the computing system. However, the density and thus airflow impedance of PSUs also increases as total power consumption requirements increase. The increase in power consumption also requires more powerful internal fans in the PSUs to ensure adequate removal of heat and proper operation of the PSUs.

The airflow generated by the fans causes a circulation phenomenon from an outlet side to an inlet side of the PSU due to impedance of the PSU in the airflow and the imbalance between airflow generated by the fan modules in the fan wall and the internal fan in the PSU. This arrangement causes backflow from the outlet side of the PSU, thus impeding the cooling of the PSU.

FIG. 1A shows a bottom side perspective view of a prior art computing system such as a server 10 having a chassis 12. FIG. 1B is a side cutaway view of the server 10 that shows the components that require airflow for cooling. The chassis 12 is generally rectangular, having a front end 16 that is typically installed facing outward from the front of a rack. Various electronics components that generate heat are held by the chassis 12. For example, the components may include a hard disk drive 32, a CPU 34 with a heat sink 36, and a series of expansion cards 38. The front end 16 includes connectors that allow connections through cables as well as slots for easy installation of the expansion cards 38. An opposite rear end 14 includes power connections for a series of power supply units (PSUs) 20. The chassis 12 holds a row of fan modules 22 arranged in a fan wall 24 near the rear end 14. The fan modules 22 in the fan wall 24 generate airflow from the front end 16 of the chassis 12 to the rear end 14. In this manner, the airflow represented by arrows 40 carries away heat generated by the electronic components of the chassis 12. In this example, two power supply units (PSU) 20 are mounted on opposing sides of the chassis 12 on top of the fan modules 22. Each of the PSUs 20 provide DC voltage supply for the electronic components of the chassis 12. In this example, the PSU 20 includes an internal fan 30 to provide cooling for the internal components of the PSU 20.

One issue that faces server designers is that too many components such as hard disk drives and expansion cards near the front end 114 may result in an increase in system impedance that prevents proper cooling of the PSUs 20. FIG. 1C is a side cutaway view of the server 10 that shows the airflow generated by one of the fan modules 22 in the fan wall 24. As shown in FIG. 1C, the PSU 20 is located directly above the fan module 22. The PSU 20 has a greater length than the fan module 22 and thus extends further into the body of the chassis 12.

The fan module 22 includes a motor that rotates fan blades to generate airflow from the front of the chassis 12 to the rear end 14. The airflow generated by the fan module 22 is represented by arrows 40. The airflow 40 is forced out of the edges of the fan module 22 around internal components, such as the motor, that block airflow directly through the center of the fan module 22. The internal fan 30 cools the internal components of the PSU 20 by creating a similar airflow from the front of the PSU 20 to the rear of the PSU 20 at the rear end 14 of the chassis 12 as represented by arrows 42. The internal fan 30 of the power supply unit is less powerful than the fan module 22. The system impedance due to the large number of components in the chassis requires greater airflow from the fan module 22. However, the greater airflow generated by the fan module 20 represented by the arrows 40 forces air back through the PSU 20, partially diverting the airflow 42 generated by the internal fan 30. The airflow 42 thus reverses through the PSU 20 and joins the airflow 40 of the fan module 22. This results in inefficient cooling of the power supply unit 20, and may impede the operation of the power supply unit 20 due to overheating.

One current solution for the backflow of air is the provision of an independent airflow tunnel for the power supply unit to separate the system airflow path generated by the fan module from the power supply unit airflow path. FIG. 2A shows a cutaway view of an example server 50 with a fan module 52 and a PSU 54 with a dedicated air tunnel 60. Similar to the system 10 in FIGS. 1A-1C, the power supply 54 is located above the fan module 52. The power supply unit 54 includes an internal fan 56 for cooling internal components of the power supply unit 54. The dedicated air tunnel 60 has an open intake end 62 near the front end of the server 50. Another open end 64 is connected to the front end of the power supply unit 54.

The air tunnel 60 provides separation from airflow generated by the fan module 52 for the power supply unit 54. FIG. 2B shows the airflow generated by the fan module 52 as arrows 70. Airflow generated by the internal fan 56 of the power supply unit 54 is shown as arrows 72. The airflow for the power supply unit 54 flows from the open end 62 of the air tunnel 60 and flows through the power supply unit 54. Thus, the dedicated air tunnel 60 separates the power supply unit 54 and the airflow 70 generated by the fan module 52, and therefore prevents interference with the airflow generated by the internal fan 56. The airflow 72 may be generated unimpeded by the airflow 70 of the fan module 52 through the tunnel 60. However, the air tunnel 60 adds to the expense of the server since the air tunnel 60 must be fabricated as a separate component, and adds additional steps to the assembly process. Moreover, the dedicated air tunnel 60 occupies space within the server 50 and increases the difficulty of component layout placement and cable routing because less internal space is available.

Thus, there is a need for a mechanism that allows a power supply unit to operate at maximum efficiency despite the airflow from a fan module. There is also a need for a compact mechanical arrangement that prevents backflow of air while permitting an increase in available space in a chassis. There is also a need for an air tunnel that allows a redirection of airflow from the internal fan of a power supply unit.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a power supply system for a computer system that protects the power supply system from backflow from a fan module is disclosed. A power supply unit has an internal fan generating an airflow from one end of the power supply unit. The power supply unit is mountable next to the fan module. An air baffle is positioned in proximity to the power supply unit to divert the airflow generated by the internal fan. An air tunnel is located on one side of the power supply unit. The air tunnel has an opening on one end for receiving the airflow diverted by the air baffle from the internal fan. The air tunnel has an opposite end in proximity to a second opening to divert the received airflow under the power supply unit.

A further implementation of the example power system is an embodiment where the air tunnel is formed from an internal structure of the computer system. Another implementation is where the computer system includes a rear panel in proximity to the power supply unit and the fan module. The air baffle is a portion of the rear panel. Another implementation is where the air baffle is a cover that is attached in a position on the computer system to block the airflow from the internal fan. Another implementation is where the air baffle and the air tunnel are integrated in a component attached to the computer system. Another implementation is where the fan module is one of a plurality of fan modules forming a fan wall. Another implementation is where the power system includes a second power supply unit mountable on a fan module of the fan wall. The second power supply unit has an internal fan. The second power supply unit is mountable in proximity to another air baffle area of the computer system diverting airflow generated by the internal fan of the second power supply unit. Another implementation is where the second power supply unit is located next to the air tunnel. Another implementation is where the power system includes a second air tunnel on one side of the second power supply unit. The second air tunnel has an opening on one end for receiving airflow diverted by the another air baffle from the internal fan of the second power supply unit. The second air tunnel has a second opening in proximity to an opposite end to divert airflow under the second power supply unit.

According to certain aspects of the present disclosure, a computer system having a chassis with two side walls, a front end, and a rear panel is disclosed. The computer system includes a fan module generating airflow from the front end to the rear end of the chassis. A power supply unit is mounted next to the fan module. The power supply unit has an internal fan generating an airflow from one end of the power supply unit. The power supply unit is positioned relative to the rear panel to allow an air baffle to divert the airflow generated by the internal fan. An air tunnel is positioned on one side of the power supply unit. The air tunnel has an opening on one end for receiving the airflow diverted by the air baffle from the internal fan and an opposite end in proximity to a second opening to divert the received airflow.

A further implementation of the example computer system is an embodiment where the air tunnel is formed from an internal structure of the chassis. Another implementation is where the air baffle is a portion of the rear panel. Another implementation is where the air baffle is a cover that is attached in a position on the rear panel to block the airflow from the internal fan. Another implementation is where the air baffle and the air tunnel are integrated in a component that is attached to the rear panel. Another implementation is where the fan module is one of a plurality of fan modules forming a fan wall. Another implementation is where the computer system includes a second power supply unit mountable on a fan module of the fan wall. The second power supply unit has an internal fan. The second power supply unit is mountable in proximity to a second air baffle diverting airflow generated by the internal fan of the second power supply unit. Another implementation is where the second power supply unit is located next to the air tunnel. Another implementation is where the computer system includes a second air tunnel on one side of the second power supply unit. The second air tunnel has an opening on one end for receiving airflow diverted by the another air baffle from the internal fan of the second power supply unit. The second air tunnel has a second opening in proximity to an opposite end to divert airflow under the second power supply unit.

According to certain aspects of the present disclosure, an airflow diversion component for preventing airflow from a fan module from interfering with airflow from a power supply unit of a computer system is disclosed. The fan module generates airflow from a front end to a rear end of the computer system. The power supply unit has an internal fan generating an airflow from one end of the power supply unit. The airflow diversion component includes an air baffle diverting the airflow from the internal fan. An air tunnel is attached to the air baffle. The air tunnel is configured to be inserted between the power supply unit and the fan module. The air tunnel includes an opening on one end for receiving the airflow diverted by the air baffle from the internal fan and an opposite end in proximity to a second opening to divert the received airflow.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
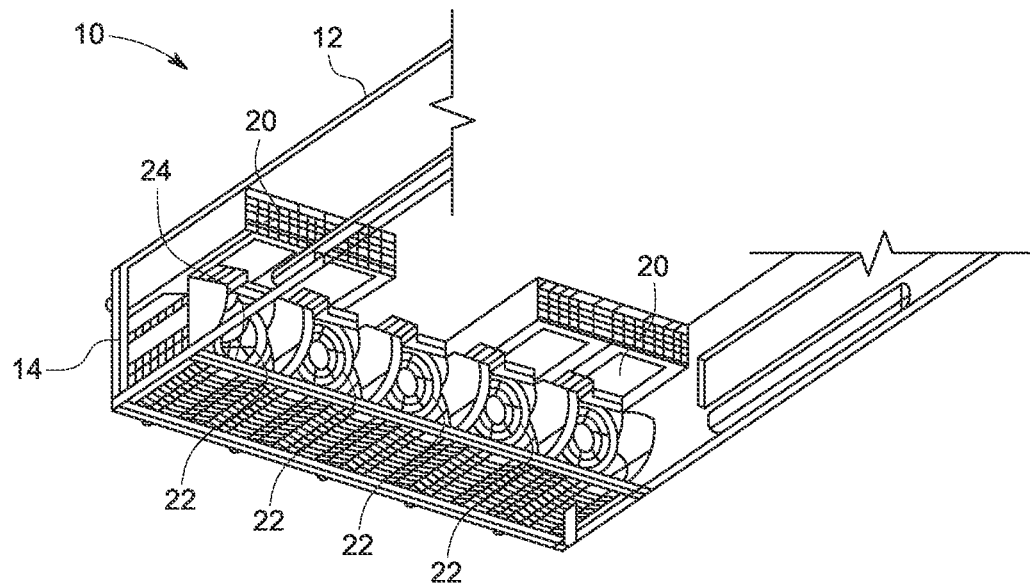
FIG. 1A is a back side perspective view of a prior art server chassis with a power supply unit located on a fan module.
Figure 1B:
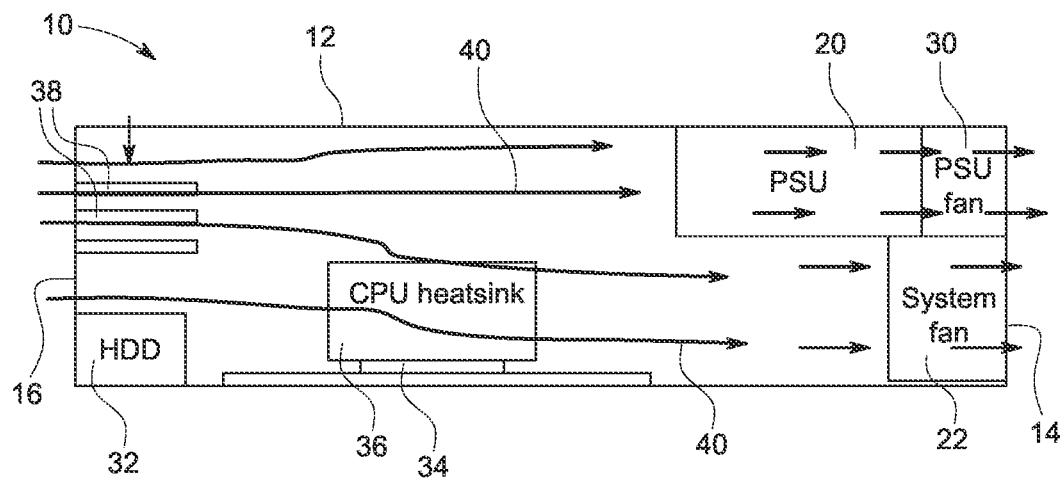
FIG. 1B is a cutaway view of the prior art server chassis in FIG. 1A, showing airflow over the components in the chassis.
Figure 1C:
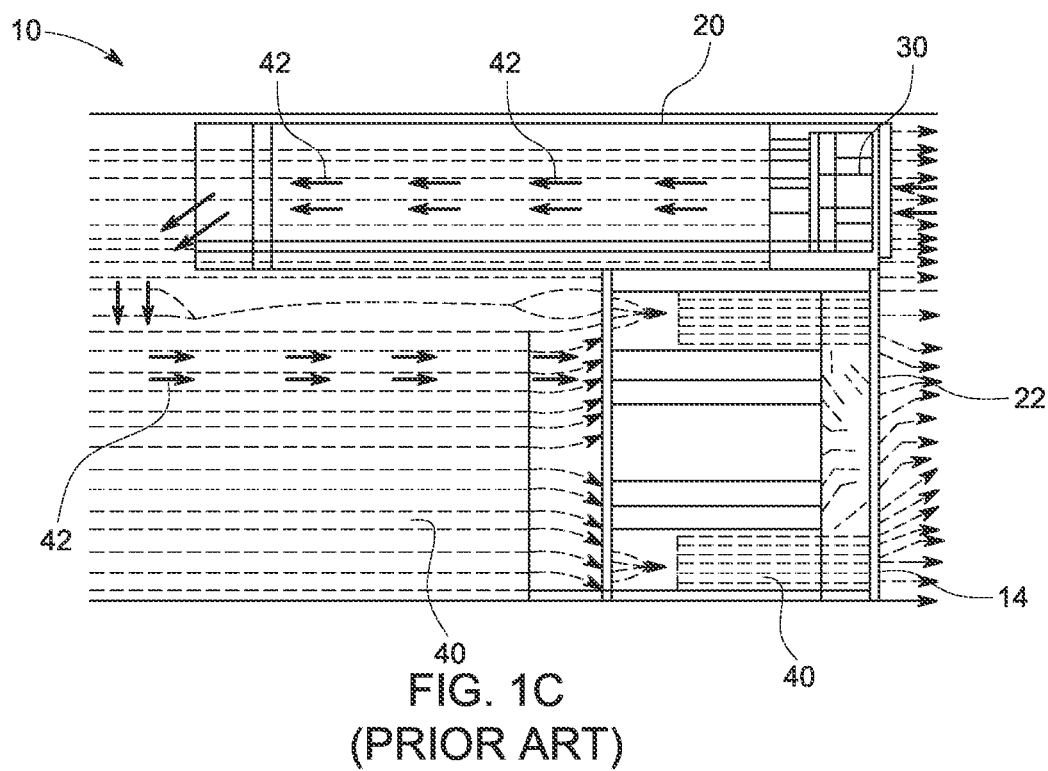
FIG. 1C is a cutaway view of the prior art server chassis in FIG. 1A, showing airflow feedback through a power supply unit.
Figure 2A:
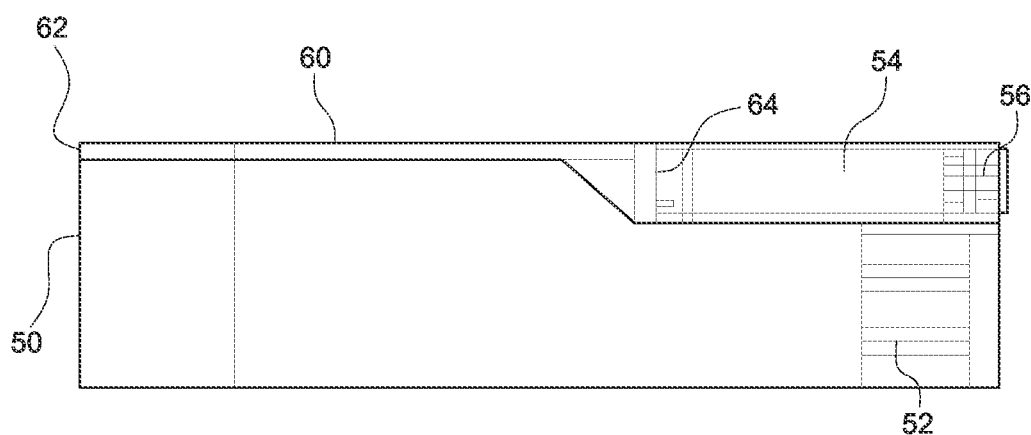
FIG. 2A is a cutaway view of a prior art server chassis having a dedicated air tunnel for the power supply unit.
Figure 2B:
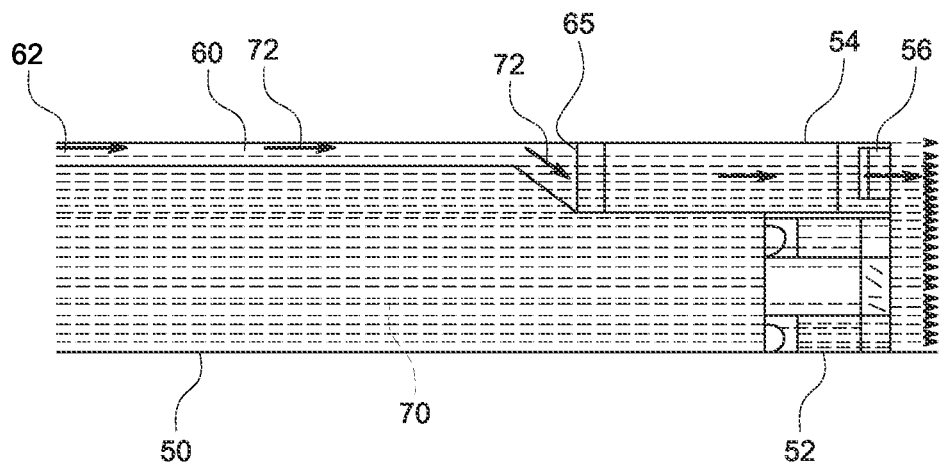
FIG. 2B is a cutaway view of the example prior art chassis in FIG. 2A, showing unimpeded airflow to the power supply unit through the dedicated air tunnel.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to a dedicated air tunnel connected to a power supply unit (PSU) in a computer system to avoid backflow from the outlet of an internal fan of the PSU. The dedicated air tunnel assists cooling of the PSU with the airflow from the computer system fan. For computer systems with multiple PSUs, the specific airflow tunnel can be designed independently for each PSU or for the total number of PSUs.

Figure 3A:
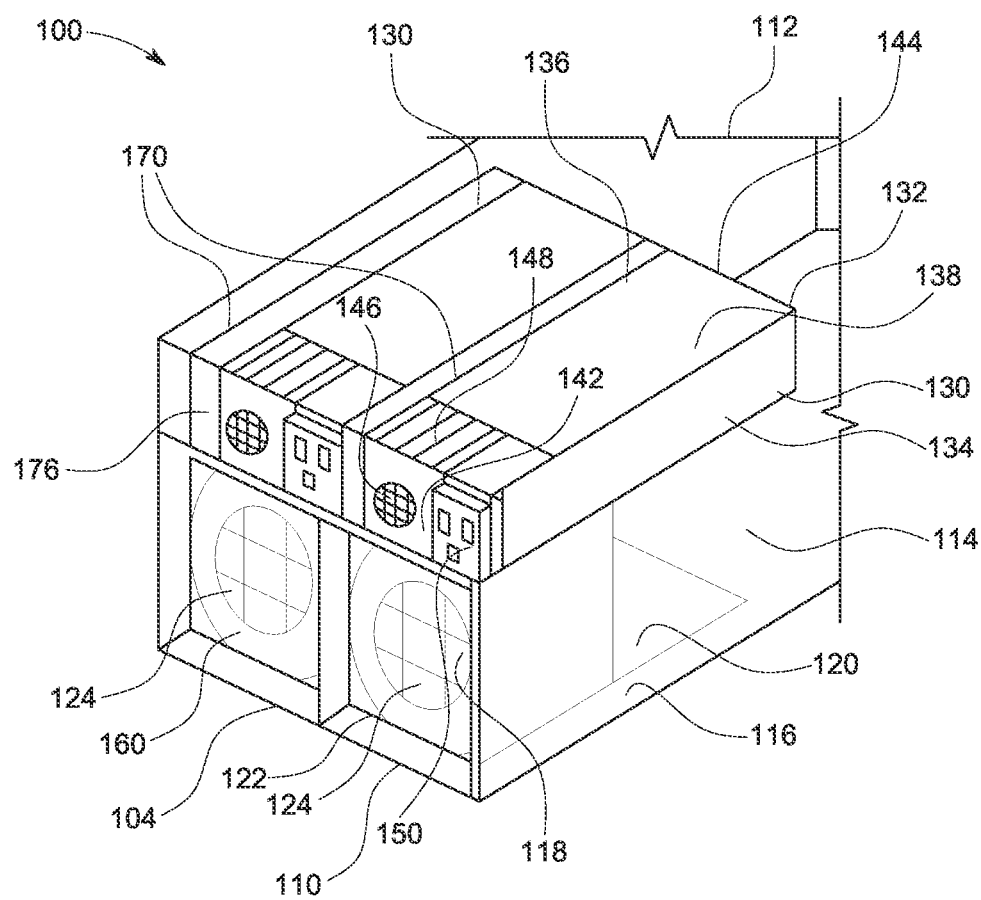
FIG. 3A is a perspective view of a compact dedicated air tunnel for the power supply unit in a computer system.
Figure 3B:
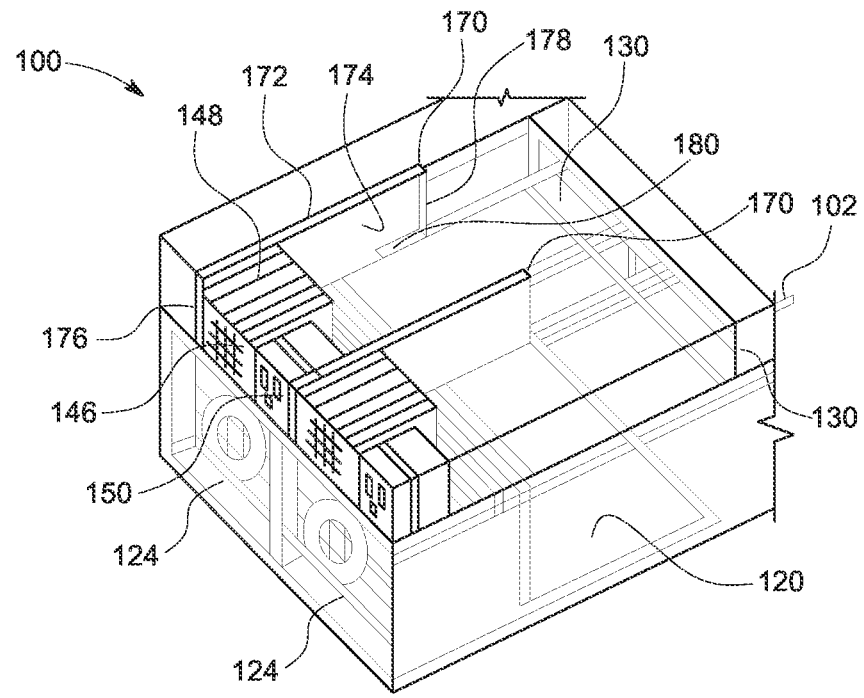
FIG. 3B is a perspective view of the air tunnel in FIG. 3A, with components of the power supply removed for clarity.
Figure 3C:
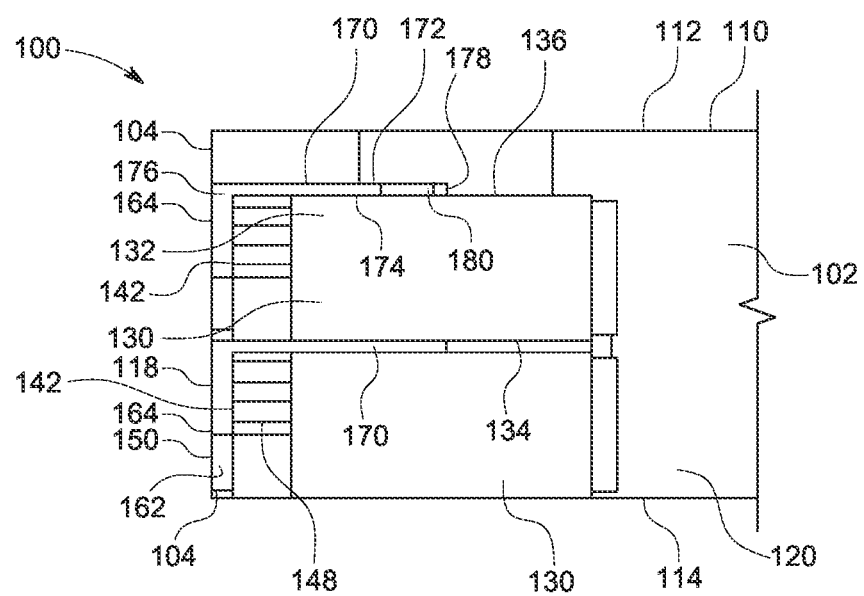
FIG. 3C is a top view of the compact dedicated air tunnel in FIG. 3A.

FIG. 3A is a perspective view of a computer system, such as a server 100, having a compact dedicated air tunnel in combination with an air baffle area for directing airflow from a power supply unit. FIG. 3B is a perspective view of the air tunnel in FIG. 3A, with components of the power supply unit removed for clarity. FIG. 3C is a top view of the compact dedicated air tunnel in FIG. 3A. The server 100 has a front end 102 and a rear end 104. The front end 102 is located at the front of the rack when the server 100 is installed in a slot in the rack. The front end 102 is generally designed with components that require service access while the server 100 remains in the rack such as cable connectors or expansion card slots. The rear end 104 includes connectors that generally require less service such as power sockets.

The server 100 includes a chassis 110 with two side walls 112 and 114. The side walls 112 and 114 are joined by a bottom panel 116. A motherboard 120 is mounted between the side walls 112 and 114. The motherboard 120 is fixed between the front end 102 and the rear end 104 of the chassis 110. The motherboard 120 includes one or more components including processors such as CPUs, network interface cards, memory devices, and the like. In this example, the motherboard includes processors that are each attached to a heat sink. The motherboard 120 also includes dual in line memory modules (DIMMs) near the processors for rapid memory. Other components such as storage devices and expansion cards may be installed on the motherboard 120.

A fan wall 122 that includes fan modules 124 is located near a rear panel 118 of the chassis 110. For simplicity, the fan wall 122 only has two fan modules 124 in this example, but the fan wall 122 have more than two fan modules. The fan wall 122 generates airflow between the side walls 112 and 114 to assist in cooling the components of the server 100. The fan modules 124 each include a motor, a series of fan blades and a power connector. The fan modules 124 are connected to a fan controller that provides a pulse width modulation signal to vary the rotation of the motor and thus the speed of the fan blades. Each of the fan modules 124 thus generates airflow in the direction from the front end 102 to the rear end 104 of the server 100. The components on the motherboard 120 generate heat when in operation and the airflow generated by the fan wall 122 cools such components.

In this example, two fan modules 124 are provided. Two power supply units 130 are mounted on top of the fan modules 124. Both of the power supply units 130 have a rectangular housing 132 that includes side walls 134 and 136, a top panel 138 and an opposite bottom panel. An external panel 142 at one end of the housing 132 faces the rear end 104 of the server 100. The other end of the housing 132 includes an internal panel 144 that includes internal power connections to provide power to components of the server 100. The external panel 142 includes a grill 146 that allows airflow generated from an internal fan 148 to exit the housing 132. In this example, the fan modules 124 generate greater airflow by having more powerful, faster motors and larger fan blades relative to the airflow generated by the corresponding components of the internal fan 148. A plug 150 on the external panel 142 allows the connection of an AC power source to the power supply unit 130. Each of the power supply units 130 include internal components such as a filter, a rectifier, a transformer, a voltage regulator, a controller, and a heat sink in the housing 132.

Incoming airflow enters through the front end 102 of the chassis 110 of the server 100. The incoming airflow passes through components in the chassis 110, resulting in an outgoing air current exiting from the rear end 104 of the chassis 110. The fan modules 124 of the fan wall 122 are configured to set a direction for the incoming airflow and the outgoing airflow, such that both the incoming airflow and the outgoing air current flow move in a same direction.

In this example, the rear panel 118 includes a lower grill section 160 that is aligned with the fan modules 124 to allow air to flow out of the chassis 110. As shown in FIG. 3C, the rear panel 118 also includes apertures 162 above the grill section 160 shown in FIG. 6A to allow access to the plugs 150 of the power supply units 130. An air baffle area 164 is a portion of the rear panel 118 that is located directly in front of the grills 146 of the power supply units 130. Thus, airflow generated by the internal fan 148 of the power supply unit 130 is diverted by the air baffle area 164 of the rear panel 118.

Each of the power supply units 130 is inserted next to a dedicated air tunnel 170 in this example. The air tunnel 170 generally has a rectangular shape with the same general height as the power supply unit 130. The air tunnel 170 in this example, is formed as part of the internal structures of the chassis 110 that allow installation of components such as the power supply units 130 and the fan modules 124. As shown in FIG. 3B-3C, the air tunnel 170 includes opposing sides 172 and 174 that are arranged parallel to each other. The sides 172 and 174 have approximately the same height as the power supply unit 130. One of the sides 174 abuts the side of the housing 132 of the power supply unit 130. The air tunnel 170 includes an open end 176 that receives diverted airflow generated from the internal fan 148. The air tunnel 170 has a length that is longer than the fan modules 124. A closed end 178 of the air tunnel 170, opposite to the open end 176, thus extends past the fan modules 124. A bottom aperture 180 is formed in the bottom of the air tunnel 170 adjacent to the closed end 178 to allow the diverted airflow to enter the space directly in front of the fan module 124.

The dedicated air tunnel 170 solves airflow circulation issues and leaves the space in the chassis 110 forward of the power supply units 130 open. The air tunnel 170 allows avoiding airflow circulation through the rear end of the power supply units 130 by providing an airflow path. The example air baffle area 164 blocks the fan exhaust area immediately in front of the grill 146. This baffle area 164 thus directs the airflow from the internal fan 148 to the open end 176 of the air tunnel 170 on the side of the housing 132 of the power supply unit 130. At the same time the air baffle area 164 prevents airflow generated by the fan modules 124 to enter the power supply unit 130. The exhaust airflow from the power supply unit 130 will thus be guided through the air tunnel 170 to a path on one side of the power supply unit 130, and flow through the bottom aperture 180 to the airflow generated by the fan modules 124.

Figure 4A:
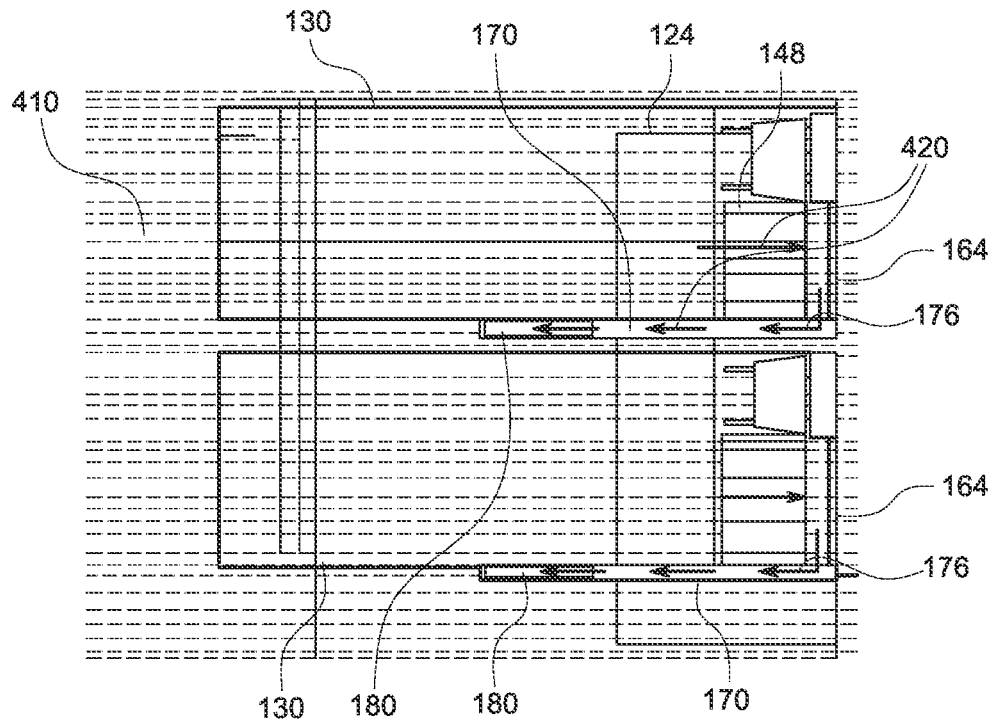
FIG. 4A is a top view of airflow patterns from the arrangement in FIG. 3A.
Figure 4B:
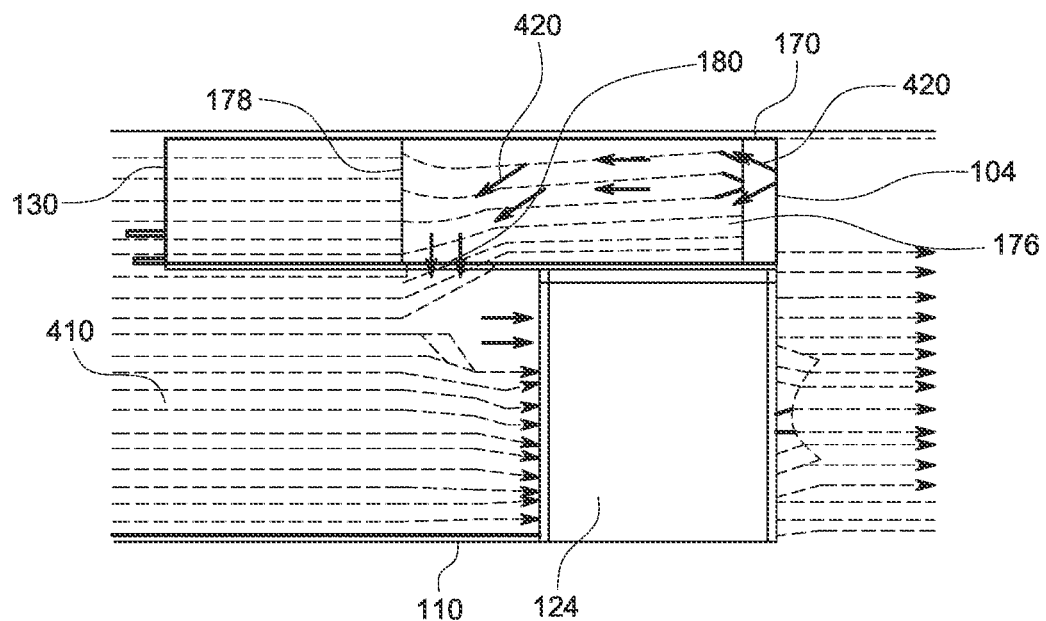
FIG. 4B is a side view of airflow patterns from the arrangement in FIG. 3A.

FIGS. 4A and 4B show a simulation of airflow created by the example air tunnel 170 in the chassis 110. FIG. 4A is a top view of the air tunnel 170 in relation to the power supply unit 130 and the fan module 124. FIG. 4B is a side view of the example air tunnel 170 in relation to the power supply unit 130 and the fan module 124. The airflow generated by the fan module 124 is shown as arrows 410. As shown in FIGS. 4A-4B, the airflow generated by the fan module 124 is prevented from pushing back air into the power supply unit 130 by the air baffle area 164. The outbound airflow from the internal fan 148 of the power supply unit 130, shown by arrows 420, is fully deployed by being diverted by the air tunnel 170 through the bottom aperture 180 to be joined with the airflow 410 from the fan module 124. Thus, the dedicated air tunnel 170 and the air baffle area 164 allows efficient cooling of the power supply unit 130 and also keeps chassis internal space available for layout/placement of additional components.

Although the air tunnel 170 may be formed as part of the internal structure of the chassis 110 and the air baffle area 164 may be designed into the shape of the rear panel 118 of the chassis 110, other arrangements may be possible. For example, when a rear panel of a chassis has an opening that allows access to both the plug and the grill of the power supply unit, a cover may be provided that serves as the air baffle to block the airflow from the grill and divert it to the side of the power supply unit. In this arrangement, the air tunnel would be similar to the air tunnel 170 as part of the internal structure of the chassis 110.

Figure 5A:
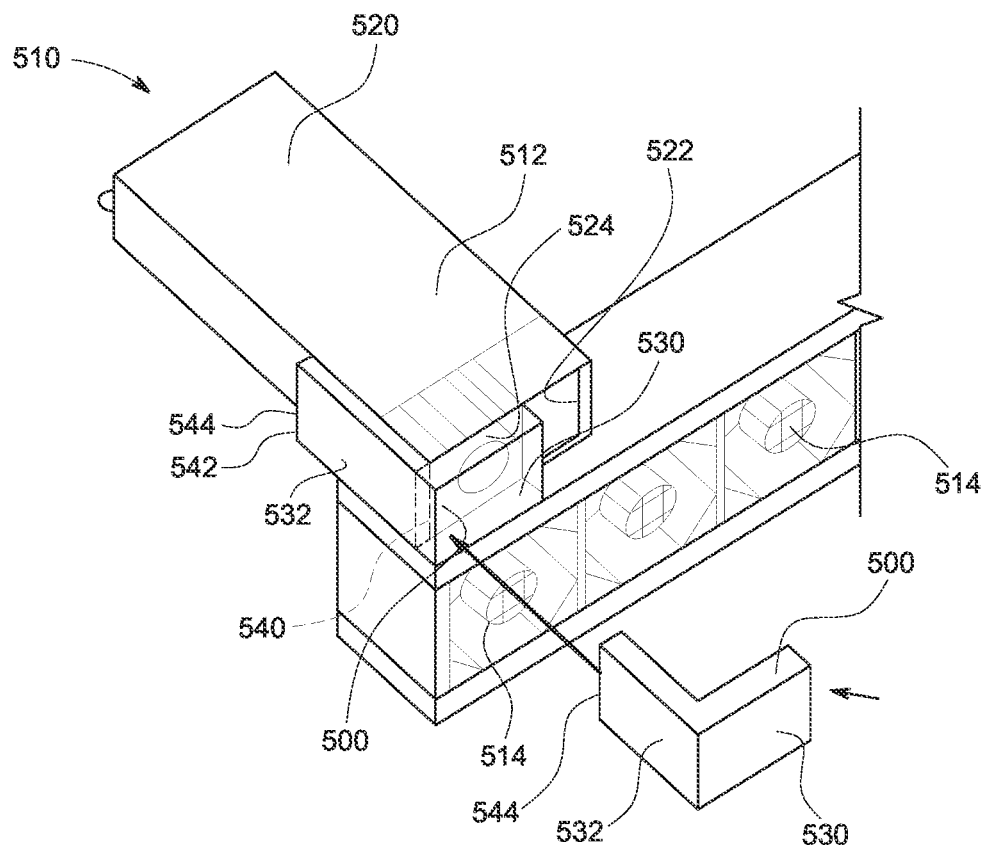
FIG. 5A is a perspective view of an example airflow diversion component for a power supply unit of the computer system in FIG. 3A.
Figure 5B:
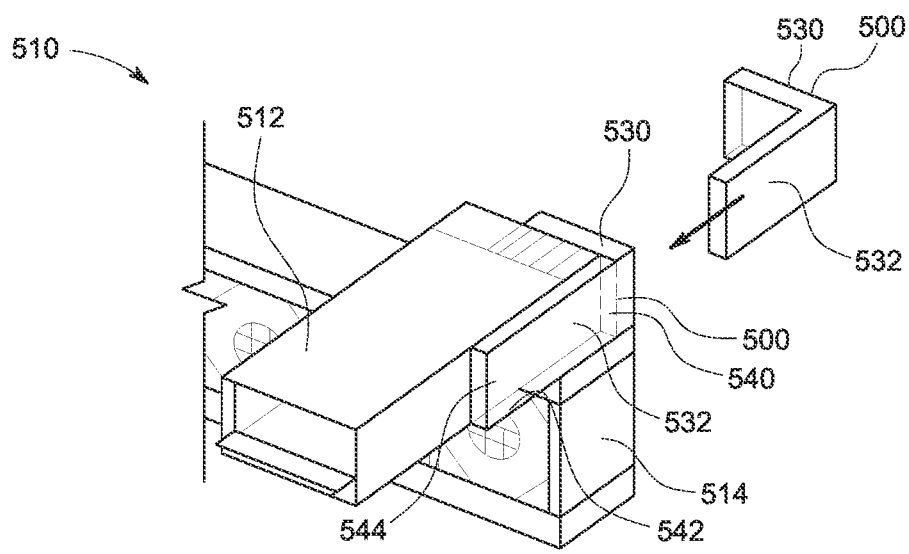
FIG. 5B is another perspective view of the example airflow diversion component in FIG. 5A.

Another alternative is a separate airflow diversion component that integrates the air baffle and the air tunnel described above. The airflow diversion component may be inserted on the rear panel of a server next to the power supply unit. FIG. 5A is a perspective view of an example airflow diversion component 500 for a power supply unit 512 of a computer system 510. FIG. 5B is another perspective view of the example airflow diversion component 500. The power supply unit 512 is mounted on fan modules 514. The power supply unit 512 includes a box shaped housing 520. One end of the housing 520 includes a plug 522 for an AC power connection and a grill 524 for venting airflow from an internal fan of the power supply unit 512. The rear of the computer system 510 provides an opening that allows access to both the plug 522 and the grill 524.

The component 500 integrates a cover 530 and an air tunnel 532 for attachment to the rear panel of the computer system 510. The cover 530 fits over the grill 524 and an air tunnel 532 that is attached in perpendicular orientation to the cover 530. The cover 530 serves as an air baffle that diverts exhaust airflow generated by the internal fan of the power supply unit 512. The cover also prevents airflow generated by the fan module 514 from interfering with the exhaust airflow from the internal fan of the power supply unit 512.

In this example, the airflow from the internal fan of the power supply unit 512 is diverted to the dedicated air tunnel 532. The air tunnel 532 is inserted on one side of the housing 520 of the power supply unit 512 and over one of the fan modules 514. In this example, the air tunnel 532 may be fit snugly between a wall of the housing of the computer system 510 and the side of the power supply unit 512. The air tunnel 532 has an open end 540 that receives the diverted airflow. The air tunnel 532 extends along part of the length of the housing 520 of the power supply unit 512 to extend over the end of the fan modules 514. A bottom aperture 542 at a closed end 544 of the air tunnel 532 opposite to the open end 540 directs the airflow from the power supply unit 512 to the airflow generated by the fan modules 514. In this manner, the air tunnel 532 allows efficient cooling of the power supply unit 512 without reflow from the airflow generated by the fan modules 514.

Although the disclosed air tunnel is described in relation to an example server, any electronic equipment using fan modules and power supply units may apply the principles described herein. Such electronic equipment may include storage devices such as a just a bunch of disks (JBOD), network switches, routers, telecommunications components, and the like.

Figure 6A:
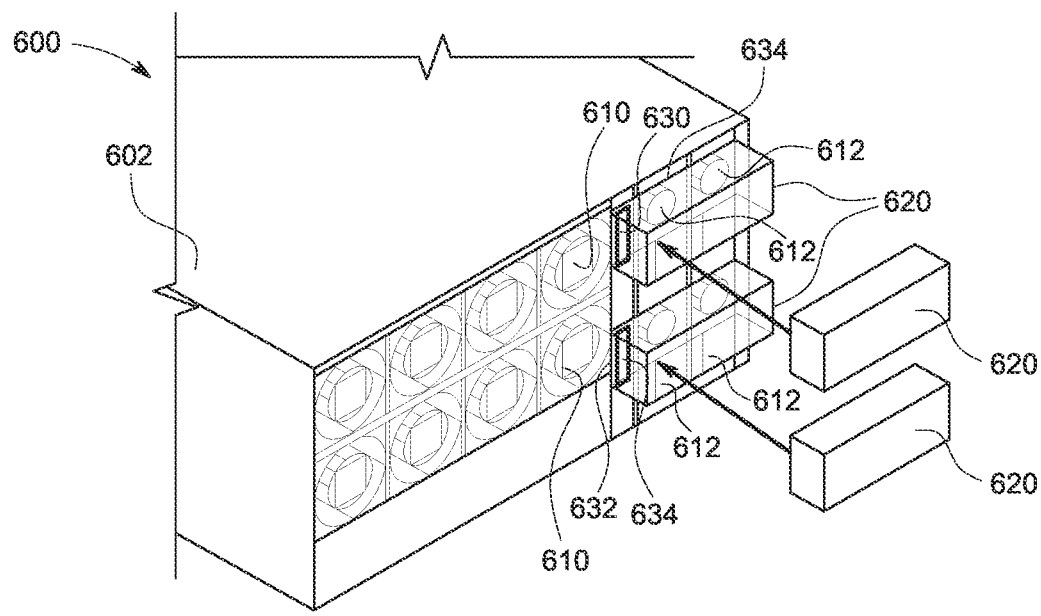
FIG. 6A is a back perspective view of another example chassis with a dedicated air tunnel for two power supply units.
Figure 6B:
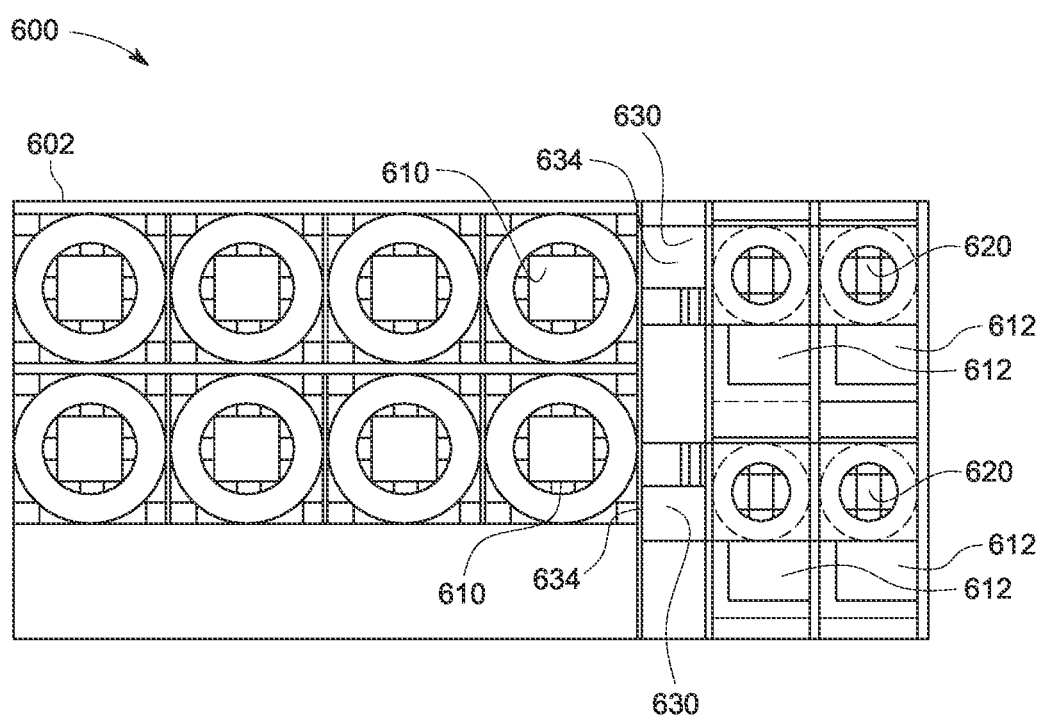
FIG. 6B is a rear view of the chassis in FIG. 6A.

Other variations of the side mounted dedicated air tunnel may be used. For example, a single air tunnel may be used for multiple power supply units with appropriate placement of the air baffle. FIG. 6A is a back perspective view of another arrangement for PSU dedicated air tunnels for a computer system 600 according to principles disclosed herein. FIG. 6B is a back view of the computer system 600. The computer system 600 includes a chassis 602 with internal structures to support two rows of fan modules 610 with power supply units 612 arranged to the side of each row of the fan modules 610. Each of the power supply units 612 may be similar to the power supply unit 130 in FIGS. 3A-3C. In this example, the power supply units 612 are oriented sideways relative to the power supply unit 130 in FIG. 3A, so the grills of the power supply units 612 are located above the power plugs. Thus, the grills of the power supply units 612 are arranged in a row above a row of the plugs. Two covers 620 are inserted over each set of two power supply units 612. The covers 620 serve as air baffles that divert exhaust airflow generated by the internal fans of the power supply units 612. The covers 620 also prevent airflow generated by the fan modules 610 from interfering with the exhaust airflow from the internal fans of the power supply units 612.

In this example, the airflow from the internal fans of the power supply units 612 is diverted to either an upper air tunnel 630 or a lower air tunnel 632. The air tunnels 630 and 632 are located between the power supply units 612 and the fan modules 610. The air tunnels 630 and 632 have open ends 634 that receive the diverted airflow. The air tunnels 630 and 632 extend along part of the length of the power supply units 612 to extend over from the ends of the fan modules 610. An aperture at a closed end of each of the tunnels 630 and 632, opposite the open ends 634, directs the airflow from the power supply units 612 to the airflow generated by the fan modules 610. In this manner, the air tunnels 630 and 632 allows efficient cooling of the power supply units 612 without reflow from the airflow generated by the fan modules 610.

It is to be understood that while the air tunnels 630 and 632 are built into the internal structure of the chassis 602, the air tunnels 630 and 632 may be part of the covers 620 and thus inserted between the fan module 610 and the power supply unit 612, when the cover 620 is attached. The covers 620 may also be different shapes to accommodate more than two power supply units. Thus, a single dedicated air tunnel may divert the airflow from more than one power supply unit.

Figure 7A:
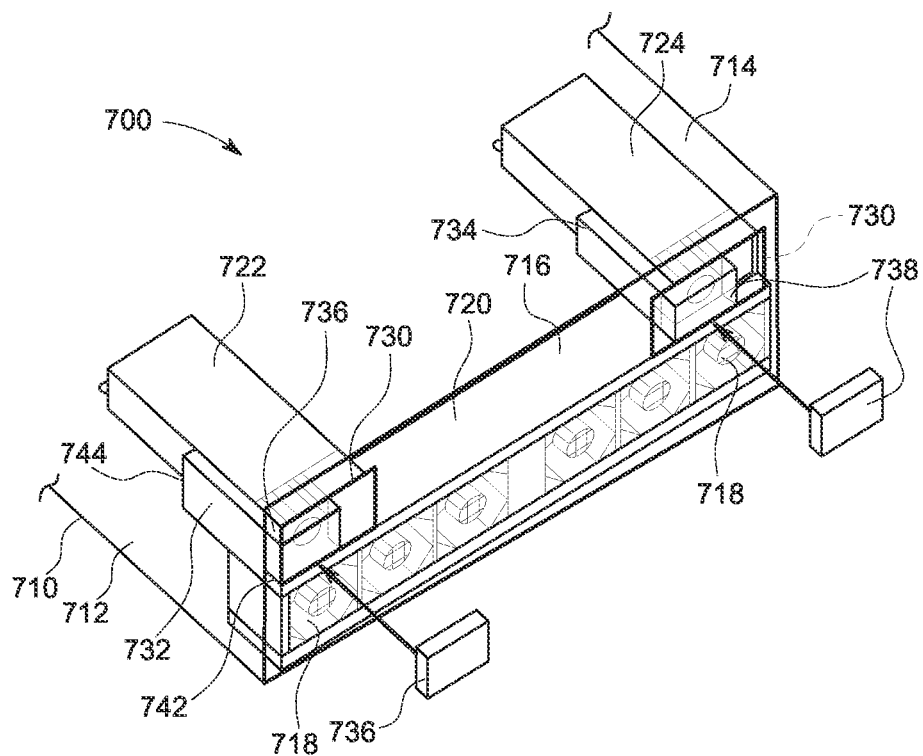
FIG. 7A is a rear perspective view of a chassis having separated power supply units and dedicated compact air tunnels.
Figure 7B:
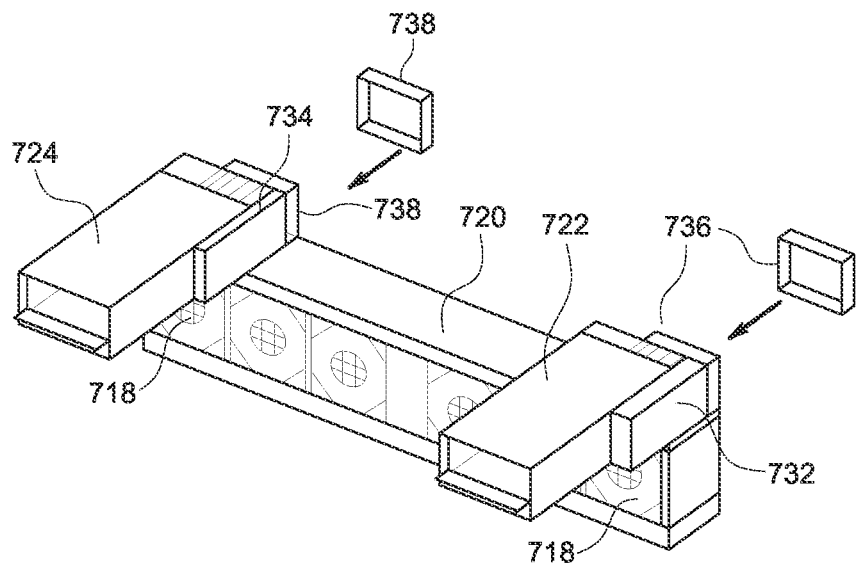
FIG. 7B is an interior perspective of the chassis in FIG. 7A.

Another chassis arrangement incorporating the compact air tunnel and air baffles allows separation of power supply units. FIG. 7A is a rear perspective view of a chassis 710 of a computer system 700 having separated power supply units and dedicated compact air tunnels. FIG. 7B is an interior perspective of the chassis 710. The chassis 710 has side walls 712 and 714. In this example, fan modules 718 are arranged near a rear panel 716 to form a fan wall 720. A power supply unit 722 is mounted on the fan modules 718 near the side wall 712. A second power supply unit 724 is mounted on the fan modules 718 near the side wall 714.

Each of the power supply units 722 and 724 are mounted next to a dedicated respective airflow tunnel 732 and 734. In this example, the airflow tunnels 732 and 734 are formed as part of the internal structure of the chassis 710. The rear panel 716 has openings 730 that allow access to the grills and plugs of the power supply units 722 and 724. Covers 736 and 738 are sized to overlap part of the openings 730 aligned with the grills of the power supply units 722 and 724. The covers 736 and 738 thus act as air baffle aligned with each of the respective power supply units 722 and 724. The covers 736 and 738 block the exhaust airflow generated by the internal fans of the respective power supply units 722 and 724. The covers 736 and 738 also prevent the airflow from the fan modules 718 from interfering with the exhaust airflow from the power supply units 722 and 724. Although the covers 736 and 738 are separate components that attached to the rear panel 716, the air baffle function of the covers 736 and 738 may be performed by shaping the openings 730 of the rear panel 716 to only allow access to the plugs of the power supply units 722 and 724. In this manner, similar to the rear panel 118 in FIGS. 3A-3C, areas of the rear panel 716 functions as the air baffle for the power supply units 722 and 724.

The airflow tunnel 732 has an open end 742 that receives the diverted airflow. The airflow tunnel 732 extends along part of the length of the power supply unit 722 to extend over the end of the fan module 718 under the power supply unit 722. A bottom aperture at a closed end 744 of the airflow tunnel 732, opposite to the open end 742, directs the airflow from the power supply unit 722 to the airflow generated by the fan modules 718. In this manner, the airflow tunnel 732 allows efficient cooling of the power supply unit 722 without reflow from the airflow generated by the fan modules 718. The airflow tunnel 734 for the power supply unit 724 functions in an identical manner.

Figure 8A:
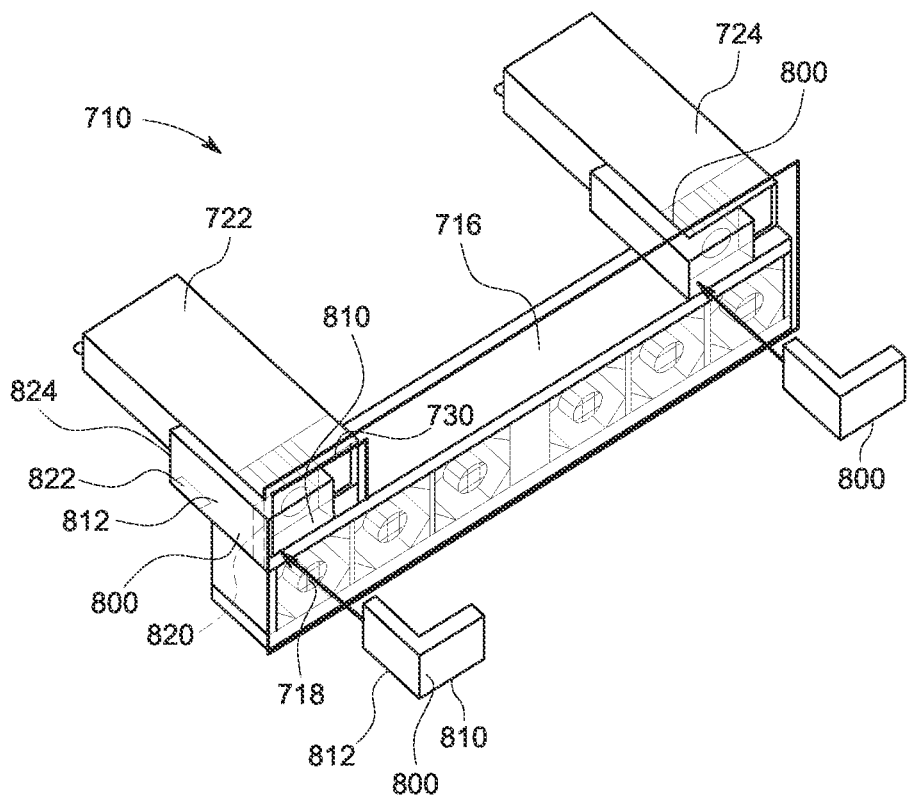
FIG. 8A is a rear perspective view of the chassis in FIG. 7A with an airflow diversion component for diverting airflow from a power supply unit.
Figure 8B:
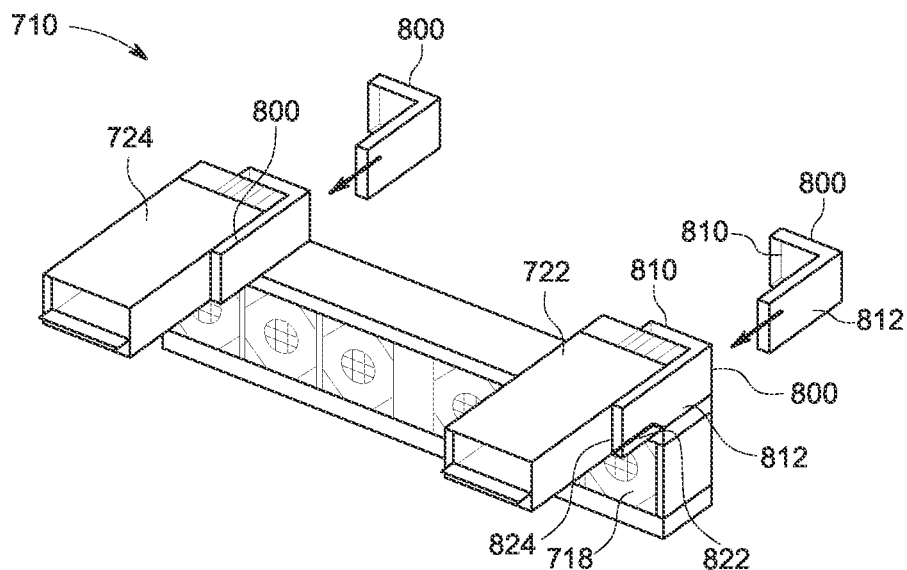
FIG. 8B is an interior perspective of the chassis with the airflow diversion component in FIG. 8A.

The airflow tunnel 732 and the cover 736 in FIGS. 7A-7B may be provided as a single integrated airflow diversion component. FIG. 8A is a rear perspective view of the chassis 710 in FIG. 7A with a combined airflow diversion component 800 for diverting airflow from the power supply units 722 and 724. FIG. 8B is an interior perspective of the chassis 710 with the airflow diversion component 800. Like elements in FIGS. 8A-8B are labeled with like element numbers as their counterparts in FIG. 7A.

The airflow diversion component 800 includes an integrated cover 810 and an air tunnel 812. The air tunnel 812 is arranged in perpendicular orientation to the cover 810. The cover 810 fits over the part of the opening 730 of the rear panel 716 in alignment with the grill of the power supply unit 722. The cover 810 serves as an air baffle that diverts exhaust airflow generated by the internal fan of the power supply unit 722. The cover 810 also prevents airflow generated by the fan modules 718 from interfering with the exhaust airflow from the internal fan of the power supply unit 722.

In this example, the airflow from the internal fan of the power supply unit 722 is diverted to the dedicated air tunnel 812. The air tunnel 812 is inserted on one side of the power supply unit 722 and over one of the fan modules 718. The air tunnel 812 has an open end 820 that receives the diverted airflow. The air tunnel 812 extends along part of the length of the power supply unit 722 to extend over one the fan modules 718. A bottom aperture 822 at an opposite closed end 824 of the air tunnel 812 directs the airflow from the power supply unit 722 to the airflow generated by the fan modules 718. In this manner, the air tunnel 812 allows efficient cooling of the power supply unit 722 without reflow from the airflow generated by the fan modules 718.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A power supply system for a computer system having a fan module, the power supply system comprising:
    a power supply unit having an internal fan generating an airflow from one end of the power supply unit, the power supply unit mountable next to the fan module;
    an air baffle positioned in proximity to the power supply unit diverting the airflow generated by the internal fan; and
    an air tunnel on one side of the power supply unit, the air tunnel having an opening on one end for receiving the airflow diverted by the air baffle from the internal fan and an opposite end in proximity to a second opening to divert the received airflow under the power supply unit.

2. The power supply system of claim 1, wherein the air tunnel is formed from an internal structure of the computer system.

3. The power supply system of claim 2, wherein the computer system includes a rear panel in proximity to the power supply unit and the fan module, wherein the air baffle is a portion of the rear panel.

4. The power supply system of claim 2, wherein the air baffle is a cover that is attached in a position on the computer system to block the airflow from the internal fan.

5. The power supply system of claim 1, wherein the air baffle and the air tunnel are integrated into a component attached to the computer system.

6. The power supply system of claim 1, wherein the fan module is one of a plurality of fan modules forming a fan wall.

7. The power supply system of claim 6, further comprising a second power supply unit mountable on a fan module of the fan wall, wherein the second power supply unit has an internal fan, and wherein the second power supply unit is mountable in proximity to another air baffle diverting airflow generated by the internal fan of the second power supply unit.

8. The power supply system of claim 7, wherein the second power supply unit is located next to the air tunnel.

9. The power supply system of claim 7, further comprising a second air tunnel on one side of the second power supply unit, the second air tunnel having an opening on one end for receiving airflow diverted by the another air baffle from the internal fan of the second power supply unit and a second opening in proximity to an opposite end to divert airflow under the second power supply unit.

10. A computer system comprising:
    a chassis having two side walls, a front end, and a rear panel;
    a fan module generating airflow from a front end to a rear end of the chassis;
    a power supply unit mounted next to the fan module, the power supply unit having an internal fan generating an airflow from one end of the power supply unit, wherein the power supply unit is positioned to allow an air baffle to divert the airflow generated by the internal fan; and
    an air tunnel is positioned on one side of the power supply unit, the air tunnel having an opening on one end for receiving the airflow diverted by the air baffle from the internal fan and an opposite end in proximity to a second opening to divert the received airflow.

11. The computer system of claim 10, wherein the air tunnel is formed from an internal structure of the chassis.

12. The computer system of claim 11, wherein the air baffle is a portion of the rear panel.

13. The computer system of claim 11, wherein the air baffle is a cover that is attached in a position on the rear panel to block the airflow from the internal fan.

14. The computer system of claim 10, wherein the air baffle and the air tunnel are integrated into a component that is attached to the rear panel.

15. The computer system of claim 10, wherein the fan module is one of a plurality of fan modules forming a fan wall.

16. The computer system of claim 10, further comprising a second power supply unit mountable on a fan module of the fan wall, wherein the second power supply unit has an internal fan, and wherein the second power supply unit is mountable in proximity to a second air baffle of the computer system diverting airflow generated by the internal fan of the second power supply unit.

17. The computer system of claim 16, wherein the second power supply unit is located next to the air tunnel.

18. The computer system of claim 16, further comprising a second air tunnel on one side of the second power supply unit, the second air tunnel having an opening on one end for receiving airflow diverted by the another air baffle from the internal fan of the second power supply unit and a second opening in proximity to an opposite end to divert airflow.

19. An airflow diversion component for preventing airflow from a fan module from interfering with airflow from a power supply unit of a computer system, the fan module generating airflow from a front end to a rear end of the computer system; and the power supply unit having an internal fan generating an airflow from one end of the power supply unit, the airflow diversion component comprising: an air baffle diverting the airflow from the internal fan; and an air tunnel attached to the air baffle, the air tunnel configured to be inserted between the power supply unit and the fan module, wherein the air tunnel includes an opening at one end for receiving the airflow diverted by the air baffle from the internal fan and a second opening in proximity to an opposite end to divert the received airflow.

\* \* \* \* \*